United States Patent
Toratani et al.

(10) Patent No.: US 11,137,215 B2
(45) Date of Patent: Oct. 5, 2021

(54) FLAT HEAT PIPE

(71) Applicant: FURUKAWA ELECTRIC CO., LTD., Tokyo (JP)

(72) Inventors: Tomoaki Toratani, Tokyo (JP); Yoshinori Nakamura, Tokyo (JP); Yoshikatsu Inagaki, Tokyo (JP); Hirofumi Aoki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 91 days.

(21) Appl. No.: 16/574,741

(22) Filed: Sep. 18, 2019

(65) Prior Publication Data

US 2020/0025459 A1     Jan. 23, 2020

Related U.S. Application Data

(63) Continuation of application No. PCT/JP2018/019962, filed on May 24, 2018.

(30) Foreign Application Priority Data

Jun. 1, 2017 (JP) .............................. JP2017-109319

(51) Int. Cl.
    *F28D 15/02*     (2006.01)
    *F28D 15/04*     (2006.01)
    *H05K 7/20*     (2006.01)

(52) U.S. Cl.
    CPC ........ F28D 15/0233 (2013.01); *F28D 15/046* (2013.01); *H05K 7/20336* (2013.01); *H05K 7/20509* (2013.01)

(58) Field of Classification Search
    CPC .............. F28D 15/0233; F28D 15/046; H05K 7/20509; H05K 7/20336

(Continued)

(56) References Cited

U.S. PATENT DOCUMENTS 5,427,174 A * 6/1995 Lomolino, Sr. ..... F28D 15/0233
                                            165/104.13
6,115,252 A    9/2000 Ohta et al.
(Continued)

FOREIGN PATENT DOCUMENTS

JP     62-131277 U     8/1987
JP     3-247994 A     11/1991
(Continued)

OTHER PUBLICATIONS

International Search Report dated Jul. 31, 2018 in PCT/JP2018/019962, filed May 24, 2018 (with English translation).

(Continued)

*Primary Examiner* — Joel M Attey

(74) *Attorney, Agent, or Firm* — Oblon, McClelland, Maier & Neustadt, L.L.P.

(57) ABSTRACT

There is provided a flat heat pipe that is not easily deformed in spite of a reduction in thickness and can maintain high heat transport capacity.

A flat heat pipe 100 includes a container 130 in which a cavity 130S is formed by plates 110 (110a, 110b) made of metal and disposed substantially in parallel with each other, working fluid that is enclosed in the cavity 130S, and a wick structure 150 that is inserted into the container. The wick structure 150 includes a first sheet-like member 140, and hollow protruding portions 170 protruding in a height direction of the container 130 are formed on the first sheet-like member 140.

7 Claims, 7 Drawing Sheets

(58) Field of Classification Search
USPC ........................................ 165/104.11, 104.26
See application file for complete search history.

(56) References Cited

U.S. PATENT DOCUMENTS

| | | | |
|---|---|---|---|
| 6,397,935 | B1 | 6/2002 | Yamamoto et al. |
| 2002/0056542 | A1 | 5/2002 | Yamamoto et al. |
| 2009/0032227 | A1* | 2/2009 | Krassowski .......... C04B 41/009 165/104.26 |
| 2013/0337169 | A1* | 12/2013 | Chen .................. C23C 18/1216 427/240 |
| 2014/0190667 | A1* | 7/2014 | McGlen .................. B23P 15/26 165/104.26 |
| 2017/0350657 | A1* | 12/2017 | Yeh ..................... F28D 15/0233 |

FOREIGN PATENT DOCUMENTS

| | | |
|---|---|---|
| JP | 9-329396 A | 12/1997 |
| JP | 10-38484 A | 2/1998 |
| JP | 2000-22369 A | 1/2000 |
| JP | 2000-74581 A | 3/2000 |
| JP | 2002-22380 A | 1/2002 |
| JP | 2002-62067 A | 2/2002 |
| JP | 3084218 U | 3/2002 |
| JP | 2004-238672 A | 8/2004 |
| JP | 2007-64523 A | 3/2007 |

OTHER PUBLICATIONS

Office Action dated Feb. 16, 2018 in Japanese Application 2017-109319 (with English Translation).
Final Office Action dated Jul. 10, 2018 in Japanese Application 2017-109319 (with English Translation).
Office Action dated May 6, 2019 in Taiwanese Application 107118610 (with English Translation).

\* cited by examiner

FLAT HEAT PIPE

TECHNICAL FIELD

The present invention relates to a heat pipe that cools a heating component, and more particularly, to a flat heat pipe that is used in a thin electronic device.

BACKGROUND ART

In recent years, a cooling mechanism, which is reduced in size and thickness, has been strongly desired to efficiently cool a heating element, such as a semiconductor element (CPU, GPU, or the like) mounted in a housing which is reduced in size and thickness and is improved in performance, of a tablet, a smartphone, a notebook PC, or the like. As one of typical cooling mechanisms, there is a heat pipe that transports heat to a low-temperature portion (heat radiation side) from a high-temperature portion (heat absorption side). There has been a request for a reduction in the thickness of the heat pipe and a request for the flattening of the heat pipe.

A heat pipe is a structure where condensable fluid is enclosed in a container, such as a sealed metal tube, having been subjected to vacuum deaeration as working fluid; and automatically operates due to the generation of a temperature difference. A space, which forms a flow channel for working fluid, is provided in the heat pipe; and working fluid received in the space is subjected to phase change, such as evaporation and condensation, or is moved, so that heat is transferred. Working fluid is evaporated on the heat absorption side of the heat pipe by heat transferred through the material of the container of the heat pipe (heat generated by the heating element), and the steam of the working fluid is moved to the heat radiation side of the heat pipe. That is, working fluid evaporated on the high-temperature portion flows to the low-temperature portion and radiates heat and is condensed, so that the heat pipe transports heat as the latent heat of the working fluid.

The steam of the working fluid is cooled on the heat radiation side and returns to a liquid-phase state again. The working fluid, which has returned to the liquid-phase state in this way, is moved (flows back) to the heat absorption side again. Meanwhile, a technique, which disposes a wick generating a capillary action in the container or forms fine grooves on the inner wall of the container to make the working fluid efficiently flow back to the heat absorption side again, is known.

As heat pipes, there are a round heat pipe, a flat heat pipe, and the like depending on a shape. Since a flat heat pipe (referred to as a flat plate-like heat pipe, a sheet-like heat pipe, or the like) can be easily mounted on a heating element and can obtain a large contact surface, a flat heat pipe is preferably used in an electronic device that requires a reduction in size and weight as described above.

The internal pressure of the container having been subjected to vacuum deaeration becomes equal to or lower than the atmospheric pressure according to the state of the working fluid. For this reason, in the case of a thin flat heat pipe, upper and lower plates forming the container are likely to be deformed by being depressed or distorted. As a result, the flow channel for the steam of working fluid is narrowed and heat transport capacity (the maximum amount of heat to be transported) is reduced. Accordingly, a method of suppressing the deformation of a container by providing pillars, which support upper and lower plates of the container, has been proposed for a flat heat pipe (for example, Patent Documents 1 and 2).

In a flat heat pipe disclosed in Patent Document 1, an upper plate of a container includes portions (recessed portions in Patent Document 1) protruding toward a lower plate and the recessed portions function as pillars that support the container by being joined to the lower plate. Further, Patent Document 2 discloses a flat heat pipe that includes columnar members serving as solid pillars separately provided in a container.

CITATION LIST

Patent Document

Patent Document 1: JP 2002-22380 A
Patent Document 2: JP 2002-62067 A

SUMMARY OF THE INVENTION

Problem to be Solved by the Invention

However, as a request for a reduction in the thickness of the flat heat pipe is increased, the thickness of the plate forming the container needs to be reduced. As a result, there is a problem that the depression or distortion of a portion of the plate not supported by the pillars is increased. A method of increasing the number of pillars or reducing an interval between the pillars by using the related art is taken as a countermeasure for this, but there is a problem that the flow channel for steam of working fluid is narrowed due to the pillars and heat transport capacity is reduced. That is, since the pillars obstruct the steam passage for working fluid and heat transport capacity is reduced in the related art, it is difficult to achieve both a reduction in thickness and high heat transport capacity in the flat heat pipe.

The invention has been made to solve the above-mentioned problems, and an object of the invention is to provide a flat heat pipe that is not easily deformed in spite of a reduction in thickness and can maintain high heat transport capacity.

Means for Solving Problem

In order to achieve the above-mentioned object, a flat heat pipe according to the invention includes a container in which a cavity is formed by two plates made of metal and facing each other, working fluid that is enclosed in the cavity, and a wick structure that is inserted into the container. The wick structure includes a first sheet-like member, and a hollow protruding portion protruding in a height direction of the container is formed on the first sheet-like member.

Further, it is preferable in the flat heat pipe according to the invention that the height of an internal space of the protruding portion is equal to or larger than the thickness of the first sheet-like member.

Furthermore, it is preferable in the flat heat pipe according to the invention that the protruding portion is a protrusion formed by the embossing of the first sheet-like member.

Moreover, it is preferable in the flat heat pipe according to the invention that the first sheet-like member has mesh structure, nonwoven structure, or porous structure.

Further, it is preferable in the flat heat pipe according to the invention that the wick structure further includes a substantially flat sheet-like member having mesh structure, nonwoven structure, or porous structure.

Furthermore, it is preferable in the flat heat pipe according to the invention that the material of the wick structure is any one of copper, iron, stainless steel, and a metal alloy containing copper or iron as a main component.

Moreover, it is preferable in the flat heat pipe according to the invention that the surfaces of the plates are substantially flat.

Effect of the Invention

According to the invention, it is possible to provide a flat heat pipe that is not easily deformed in spite of a reduction in thickness and can maintain high heat transport capacity.

MODE(S) FOR CARRYING OUT THE INVENTION

Figure 1:
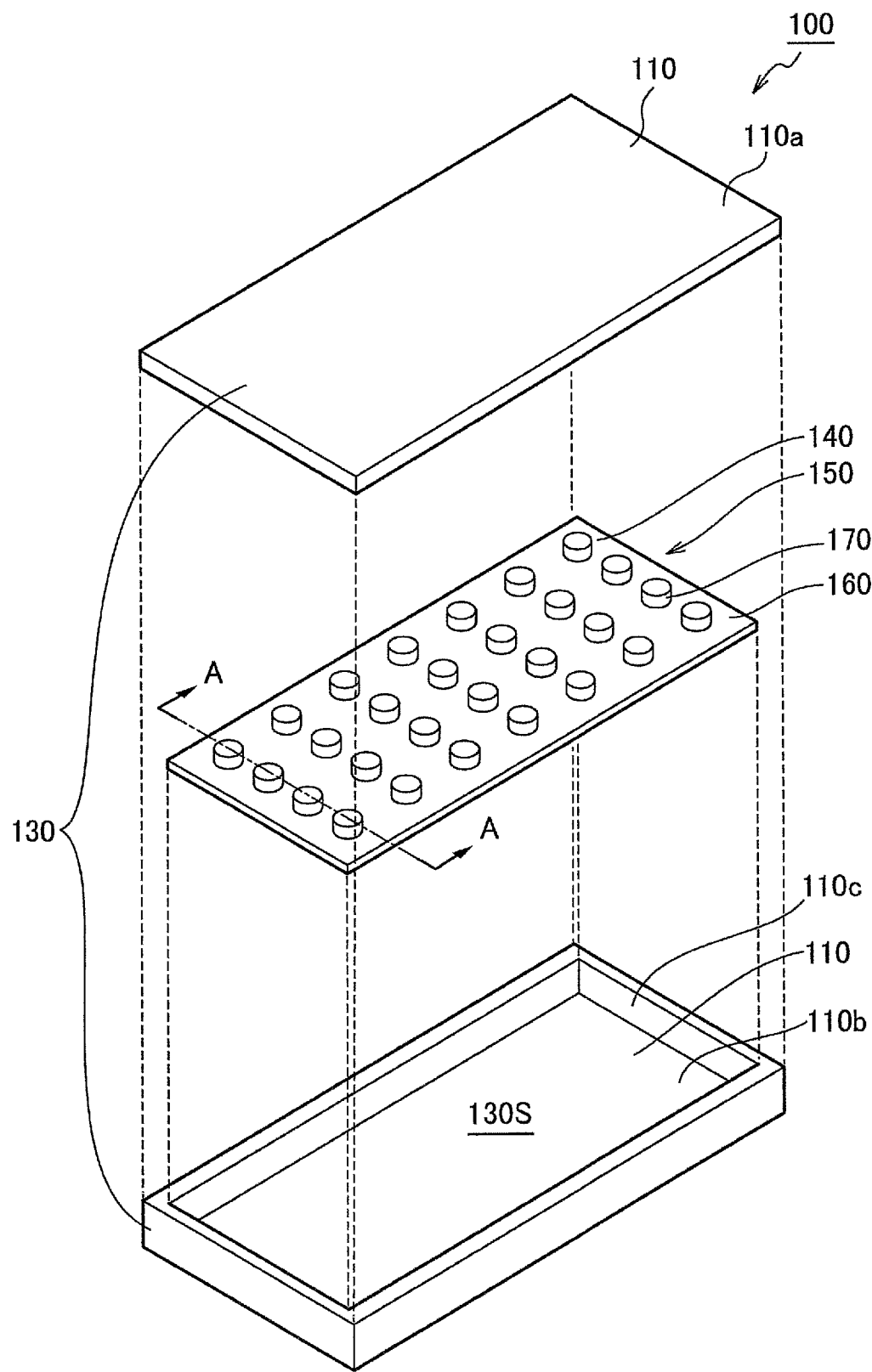
FIG. 1 is a schematic exploded view of a flat heat pipe according to an embodiment of the invention.

Examples of flat heat pipes according to preferred embodiments of the invention will be described in detail below with reference to the drawings. Meanwhile, components having the same functions will be denoted by the same reference numerals for the simplification of illustration and description.

FIG. 1 is a schematic exploded view illustrating basic components of a flat heat pipe 100 according to this embodiment. The flat heat pipe 100 includes a container 130 in which a cavity 130S is formed by plates 110 (an upper plate 110a and a lower plate 110b) disposed substantially in parallel with each other, working fluid (not illustrated) that is enclosed in the cavity 130S, and a wick structure 150 which is inserted into the container 130 and into which working fluid is permeated by a capillary force.

A side wall plate 110c is provided on the peripheral edge of the lower plate 110b of the plates 110 in this embodiment, so that the respective plates 110a, 110b, and 110c are connected to each other to form the container 130 including the cavity 130S therein. The side wall plate 110c may be provided on the upper plate 110a or may be formed by being bent from a part of the upper and lower plates 110a and 110b, and a method of connecting the plates 110a and 110b, which are disposed substantially in parallel with each other, is not limited as long as the cavity 130S is formed in the container 130 and the container 130 is sealed.

The plates 110 are made of a material, such as metal, which has a high thermal conductivity and is not easily deformed, and stainless steel is used in this embodiment. Since at least one of the upper and lower plates 110a and 110b serves as a contact surface that is in contact with a heating element, it is preferable that each of the upper and lower plates 110a and 110b is planar and the surface thereof facing the heating element is substantially flat. Accordingly, since a large contact area between the plate and the heating element is obtained and the plate can be in close contact with the heating element, thermal contact resistance can be kept low. In addition, since thermal contact resistance can be kept low even though the heating element is disposed on any one of the upper plate 110a and the lower plate 110b, the degree of freedom in the design of a device using the flat heat pipe 100 can be increased. Further, each of the surfaces of the upper and lower plates 110a and 110b facing the cavity 130S may be provided with a layer improving the wettability of working fluid or may be provided with a plurality of grooves extending in a back-flow direction so that condensed working fluid easily flows back to a high-temperature portion from a low-temperature portion.

The type of working fluid can be appropriately selected depending on an operating temperature or the like. Specifically, a small amount of water is generally used as the working fluid, but water including an antifreezing solution, ethanol, cyclopentane, ammonia, and the like may be used as the working fluid.

The wick structure 150 is a structure including a sheet-like member (first sheet-like member) 140 having structure, which can generate a capillary force, such as mesh structure, nonwoven structure, or porous structure. As illustrated in FIG. 1, the sheet-like member 140 includes protruding portions 170 that protrude in the height direction of the container 130 (between the upper and lower plates 110a and 110b) and have a circular shape in plan view, and a planar portion (a portion on which the protruding portions 170 are not formed) 160.

Here, the protruding portions 170 are formed to be arranged on the sheet-like member 140 in parallel (in the form of a lattice), but may be arranged in zigzag (60° zigzag or 45° zigzag). Further, in a case where the protruding portion 170 has a long hole shape or an elliptical shape in plan view, it is preferable that the protruding portions 170 are arranged so that the longitudinal direction of each protruding portion 170 is parallel to the direction of the flow channel for steam, that is, a direction where heat is to be transferred.

Figure 2A:
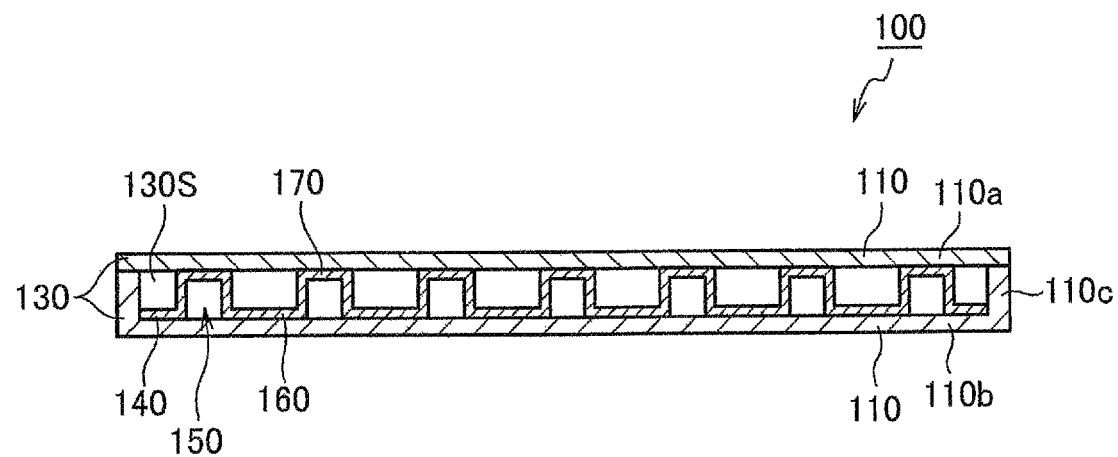
FIG. 2(a) is a longitudinal sectional view of the entire flat heat pipe illustrated in FIG. 1.
Figure 2B:
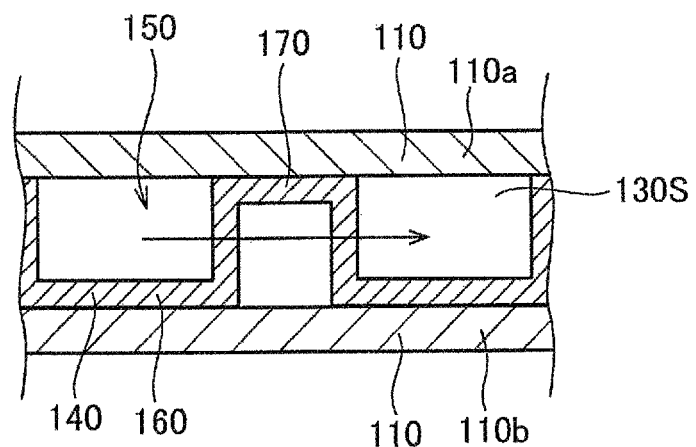
FIG. 2(b) is a partial enlarged view of the longitudinal sectional view.

Next, the wick structure 150 will be described in more detail below with reference to FIG. 2. FIG. 2(a) is a longitudinal sectional view of the entire flat heat pipe 100, and FIG. 2(b) is a partial enlarged view. As illustrated in FIGS. 2(a) and 2(b), the protruding portions 170 of the wick structure 150 are in contact with the inner surface of the upper plate 110a and the planar portion 160 on which the protruding portions 170 are not formed is in contact with the inner surface of the lower plate 110b. Accordingly, since the protruding portions 170 fulfill the same function as the pillars in the related art and the wick structure 150 can support the upper and lower plates 110a and 110b, the deformation of the container 130 can be suppressed.

The protruding portions 170 are formed to be hollow. In this embodiment, embossing (pressing) is performed on a substantially flat sheet-like member to form the protruding portions 170. Accordingly, since the protruding portions 170 and the planar portion 160 are formed integrally with each other, a process, such as etching, is not necessary. For this reason, the wick structure 150 including the protruding portions 170 can be easily manufactured at a low cost. Examples of the material of the wick structure 150, which can be subjected to embossing and has high strength and a high thermal conductivity, include copper, iron, stainless steel, a metal alloy that contains copper or iron as a main component, and the like.

Since the protruding portions 170 are formed to be hollow, a problem of a reduction in heat transport capacity caused by a reduction in the cross-sectional area of steam passages for working fluid can be suppressed even in a case where the number of the protruding portions 170 is increased or an interval between the protruding portions 170 is reduced. Specifically, a case where a heating element (not illustrated) is in contact with the left end portion of the lower plate 110b in FIG. 2(a) and working fluid becoming steam by heating is moved in the container 130 in a direction indicated by an arrow of FIG. 2(b) (to the right from the left) will be considered. In that case, since the protruding portions 170 are hollow and steam can pass through the protruding portions 170 as illustrated by the arrow, the protruding portions 170 do not obstruct the steam passages for working fluid. Accordingly, high heat transport capacity can be maintained.

Figures 4A, 4B:
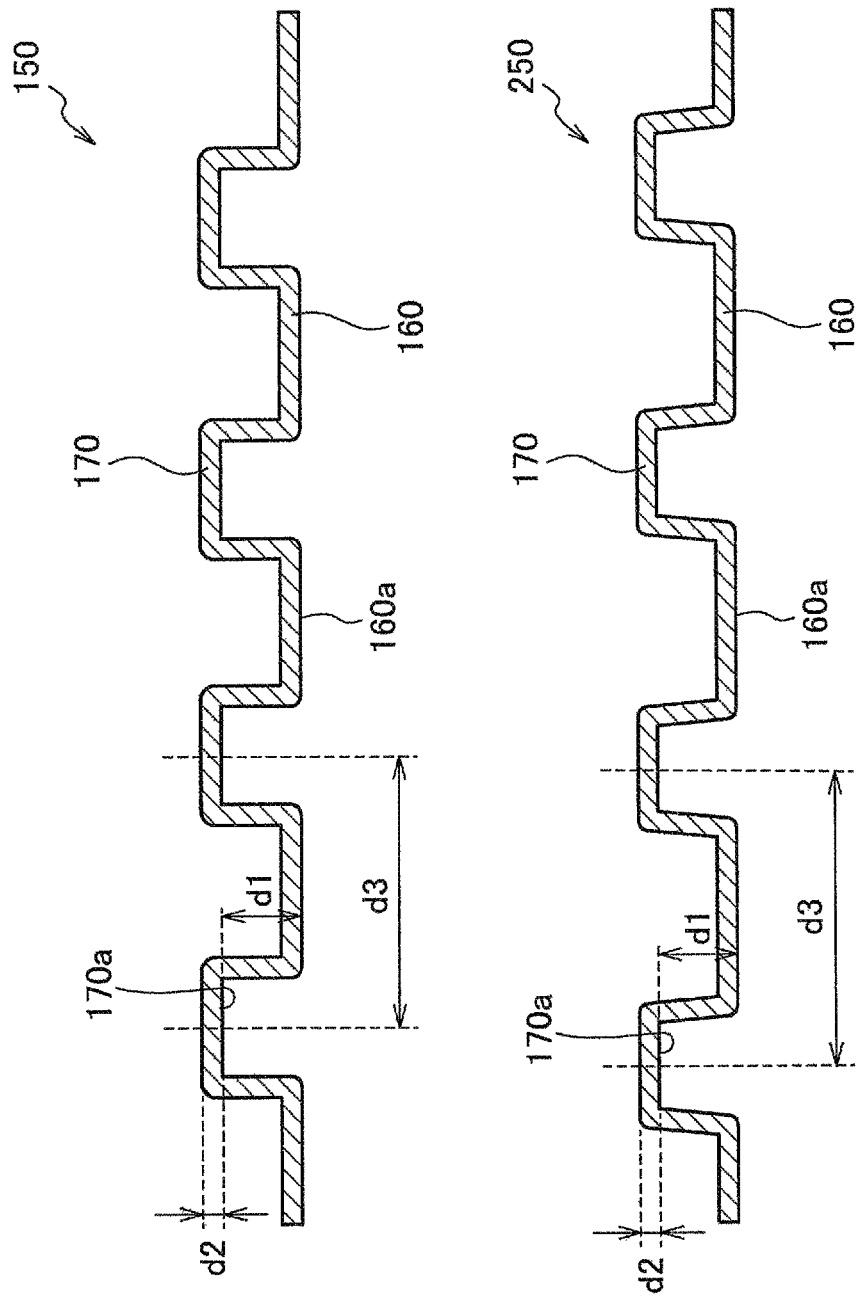
FIG. 4(a) is a cross-sectional view of a wick structure of the flat heat pipe according to the embodiment of the invention taken along line A-A illustrated in FIG. 1.
FIG. 4(b) is a cross-sectional view of the wick structure of the flat heat pipe according to the embodiment of the invention taken along line B-B illustrated in FIG. 3.

To ensure a sufficient space through which steam (working fluid) passes in the protruding portions 170, it is preferable that a height d1 of the internal space of the protruding portion 170 is equal to or larger than the thickness d2 of the sheet-like member of the wick structure 150 as illustrated in a cross-sectional view (a cross-sectional view taken along line A-A illustrated in FIG. 1) of the wick structure 150 in FIG. 4(a). Here, as illustrated in FIG. 4(a), the height d1 of the internal space is a distance between a lower surface 170a of the sheet-like member forming the protruding portion 170 and a lower surface 160a of the sheet-like member forming the planar portion 160. Meanwhile, in a case where the sheet-like member has mesh structure or the like and the lower surface 170a of each protruding portion 170 and the lower surface 160a of the planar portion 160 microscopically have an uneven shape, the height d1 of the internal space is a distance between the tip of a convex portion of the lower surface 170a and the tip of a concave portion of the lower surface 160a.

Here, it is preferable that the porosity of each protruding portion 170 (of the sheet-like member 140) of the wick structure 150 is in the range of 60% to 90%. In a case where the porosity is excessively low, there is a possibility that an effect of suppressing the deformation of the container 130 may not be sufficiently obtained. In a case where the porosity is excessively high, it is difficult for steam to pass through the protruding portions 170.

Further, it is preferable that the porosity of the planar portion 160 is lower than the porosity of the protruding portion 170 in the wick structure 150. More specifically, it is preferable that the porosity of the planar portion 160 is lower than the porosity of the protruding portions 170 by 10% or more and is in the range of 50% to 80%. In a case where the porosity of the planar portion 160 of the wick structure 150 is set in this range, working fluid condensed at the low-temperature portion can effectively return to the high-temperature portion.

A situation where the porosity of the planar portion 160 is different from the porosity of the protruding portions 170 as described above can be realized by the stretch of mesh-like pores through embossing in a case where, for example, a sheet made of metal and having mesh structure is used as the sheet-like member 140. Further, in a case where a sintered metal sheet having porous structure is used as the sheet-like member 140, the above-mentioned situation can be realized by a change in the roughness (size) of sintered metal. Furthermore, through-holes can also be formed at the protruding portions 170 in the sheet-like member 140 to realize the situation where the porosity of the planar portion 160 is different from the porosity of the protruding portions 170.

Figure 3:
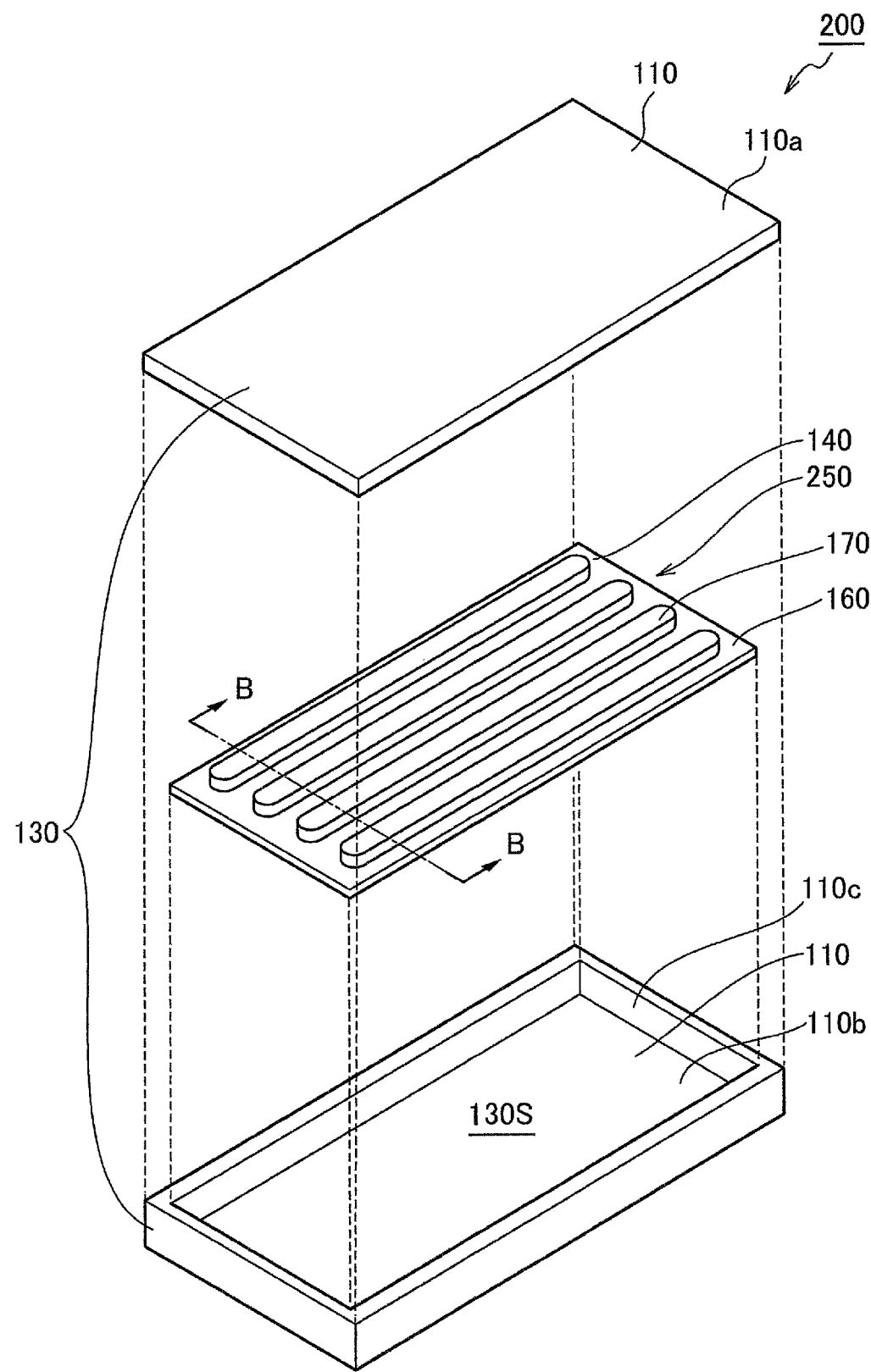
FIG. 3 illustrates an embodiment where another example is applied to a wick structure in the flat heat pipe illustrated in FIG. 1.

Next, another example of the wick structure (wick structure 250) will be described with reference to FIG. 3. FIG. 3 is a schematic exploded view illustrating basic components of a flat heat pipe 200 including the wick structure 250. In the wick structure 150 of FIG. 1, the protruding portions 170 have a columnar shape and are arranged at regular intervals so as to form four rows and seven rows in a lateral direction and a longitudinal direction, respectively. In contrast, in the wick structure 250 of FIG. 3, protruding portions 170 are arranged at regular intervals so as to form four rows and one row in a lateral direction and a longitudinal direction, respectively. Since the contact area between the upper plate 110a and the protruding portions 170 of the wick structure 250 is larger than that of the wick structure 150 of FIG. 1, the wick structure 250 has a higher effect of suppressing the deformation of the container 130. Further, since the hollow protruding portions 170 are continued in the longitudinal direction in the flat heat pipe 200 of FIG. 3, steam passages are ensured. As a result, high heat transport capacity can be maintained.

FIG. 4(b) is a cross-sectional view of the wick structure 250 taken along line B-B illustrated in FIG. 3, and an interval d3 between the protruding portions 170 of the wick structure 250 is longer in a case where the cross-sectional view of the wick structure 250 illustrated in FIG. 4(b) taken along line B-B illustrated in FIG. 3 is compared with the cross-sectional view of the wick structure 150 illustrated in FIG. 4(a) taken along line A-A illustrated in FIG. 1. That is, since the contact area between the upper plate 110a and the protruding portions 170 of the wick structure 250 is large and the wick structure 250 has a high effect of suppressing the deformation of the container 130, the interval d3 between the protruding portions 170 of the wick structure 250 can be set longer than that of the wick structure 150.

Meanwhile, the shapes and sizes of the protruding portions 170 of the wick structures 150 and 250 are exemplary; the protruding portions 170 may also have the shape of a polygonal prism, a conical shape, or the like other than the above-mentioned shape; and (the upper surfaces of) the protruding portions 170 have only to be in contact with the inner surface of the upper plate 110a and (the lower surface of) the planar portion 160 on which the protruding portions 170 are not formed have only to be in contact with the inner surface of the lower plate 110b so as to support the upper and lower plates 110a and 110b. Further, the number, the interval, and the arrangement (aligned arrangement, random arranged, or the like) of the protruding portions 170 can also be appropriately changed according to the shape and size of the protruding portion 170, the thicknesses and the sizes of the upper and lower plates 110a and 110b, and the like. Meanwhile, to ensure a sufficient space through which steam (working fluid) passes, it is preferable that the height d1 of the internal space of the protruding portion 170 is equal to or larger than the thickness d2 of the sheet-like member of the wick structure 150 as described above even in these modifications.

Preferred examples of the flat heat pipes 100 and 200 including the wick structures 150 and 250 include the following design examples.

Example 1: Flat Heat Pipe 100

The upper and lower plates 110a and 110b: a stainless steel plate having a thickness of 0.1 mm
The height of the cavity 130S of the container 130: 0.4 mm
The sheet-like member 140 of the wick structure 150: a stainless steel mesh woven with stainless steel wires, the thickness d2 is 0.1 mm and the diameter of the wire is in the range of 50 to 200 μm
Protruding portion 170: the shape of a column having a diameter of 1 mm, the height d1 of the internal space is 0.2 mm, and the interval d3 is 5 mm Example 2: Flat Heat Pipe 100

The upper and lower plates 110a and 110b: a stainless steel plate having a thickness of 0.05 mm
The height of the cavity 130S of the container 130: 0.6 mm
The sheet-like member 140 of the wick structure 150: a sheet having nonwoven structure where fine fibers made of stainless steel are solidified, the thickness d2 is 0.2 mm and the diameter of the fiber is in the range of 8 to 20 μm
Protruding portion 170: the shape of a substantially square prism having one side of 0.8 mm, the height d1 of the internal space is 0.2 mm, and the interval d3 is 1.6 mm Example 3: Flat Heat Pipe 200

The upper and lower plates 110a and 110b: a stainless steel plate having a thickness of 0.1 mm
The height of the cavity 130S of the container 130: 0.4 mm
The sheet-like member 140 of the wick structure 250: a porous sheet made of stainless steel and provided with fine through-holes, the thickness d2 is 0.12 mm
Protruding portion 170: the width of an ellipse in a lateral direction is 1 mm, the height d1 of the internal space is 0.2 mm, and the interval d3 is 7 mm Example 2 is an example where the interval d3 between the protruding portions 170 is set to 1.6 mm, that is, is set shorter than 5 mm of Example 1 since the upper and lower plates 110a and 110b have a thickness of 0.5 mm, that is, are thin and the container 130 is likely to be deformed. Further, Example 3 is an example where the interval d3 between the protruding portions 170 is set to 7 mm, that is, is set longer than those of Examples 1 and 2 since the wick structure 250 to be disposed has a high effect of suppressing the deformation of the container 130.

Next, a flat heat pipe 300 according to another embodiment of the invention will be described with reference to FIG. 5. The flat heat pipe 300 according to this embodiment further includes a substantially flat sheet-like member (second sheet-like member) 180 between the lower plate 110b and the sheet-like member 140 on which the protruding portions 170 of the flat heat pipes 100, 200 illustrated in FIG. 1 or 3 are formed. In other words, a wick structure 350 of the flat heat pipe 300 further includes the substantially flat sheet-like member 180 having mesh structure, nonwoven structure, or porous structure in addition to the wick structure 150 or 250.

The wick structure 350 can improve an effect of making working fluid flow back to a heat absorption side (heating element side) again by the substantially flat sheet-like member 180. Since the protruding portions 170 are formed on the sheet-like member by embossing or the like as illustrated in FIG. 2 in the flat heat pipes 100 and 200, the bottoms of the protruding portions 170 are not in contact with the inner surface of the lower plate 110b. For this reason, in a case where working fluid flows back to the heat absorption side by a capillary action, the working fluid cannot flow along the bottoms of the protruding portions 170 and it may be difficult for the working fluid to flow back along the lower plate 110b. Since the substantially flat sheet-like member 180 is provided in the flat heat pipe 300 so as to be in contact with the inner surface of the lower plate 110b, working fluid can easily flow back to the heat absorption side along the lower plate 110b.

Figure 5:
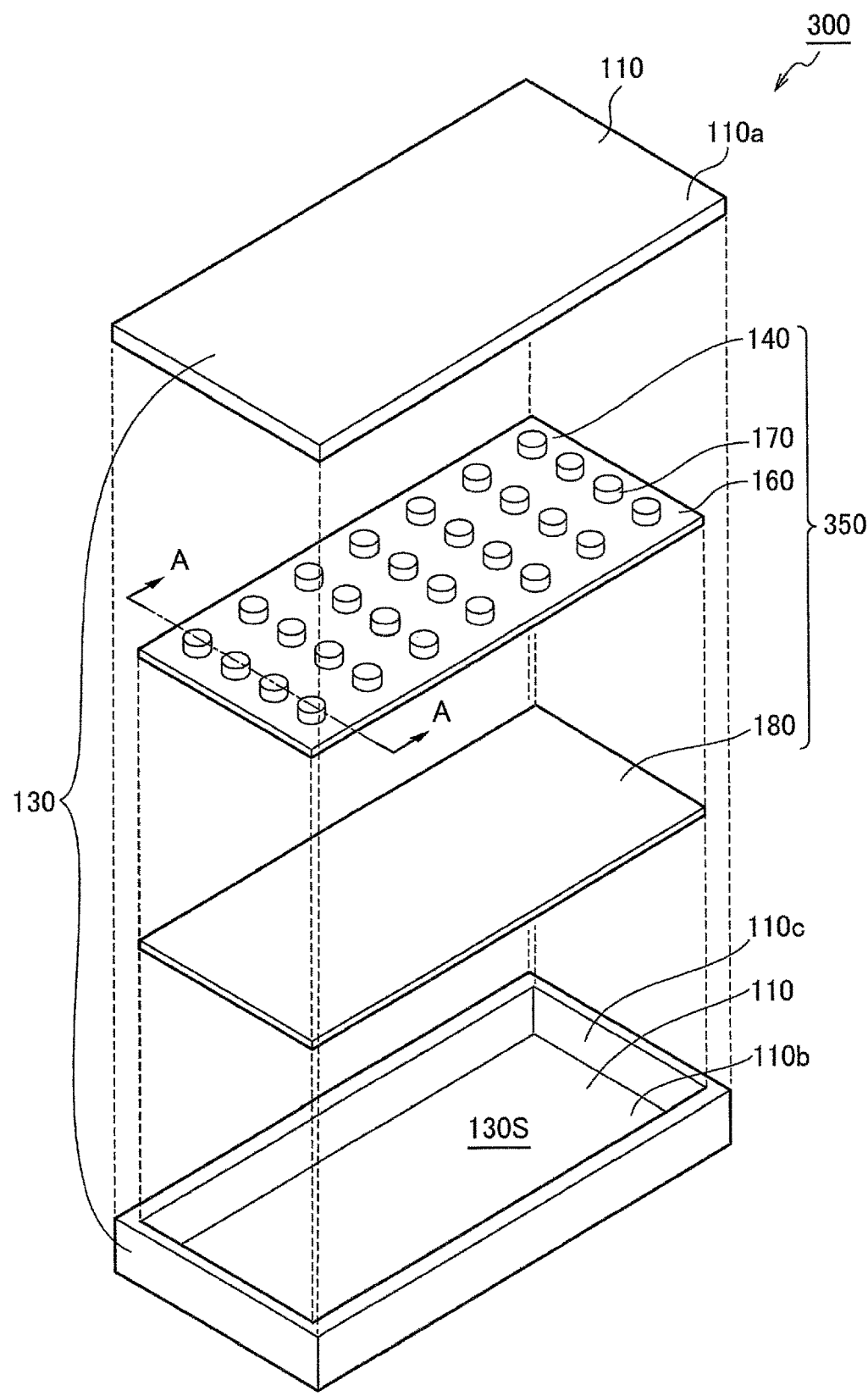
FIG. 5 is a schematic exploded view of a flat heat pipe according to another embodiment of the invention.

Meanwhile, a form where the protruding portions 170 of the sheet-like member 140 protrude upward (toward the upper plate 110a) have been described in FIG. 5, but the protruding portions 170 may protrude downward (toward the lower plate 110b). In this case, the sheet-like member 180 is disposed on the inner surface of the heat-receiving surface of the flat heat pipe 300 for the backflow and retention of working fluid.

According to the flat heat pipe of the invention, since the protruding portions 170 formed on the wick structures 150, 250, and 350 can support the upper and lower plates 110a and 110b as described above, the deformation of the container 130 can be suppressed. Further, since the protruding portions 170 are hollow and working fluid (steam) can pass through the protruding portions 170, the protruding portions 170 do not obstruct the steam passages even though the number of the protruding portions 170 is increased for a reduction in thickness or an interval between the protruding portions 170 is reduced. Accordingly, high heat transport capacity can be maintained.

Figure 6:
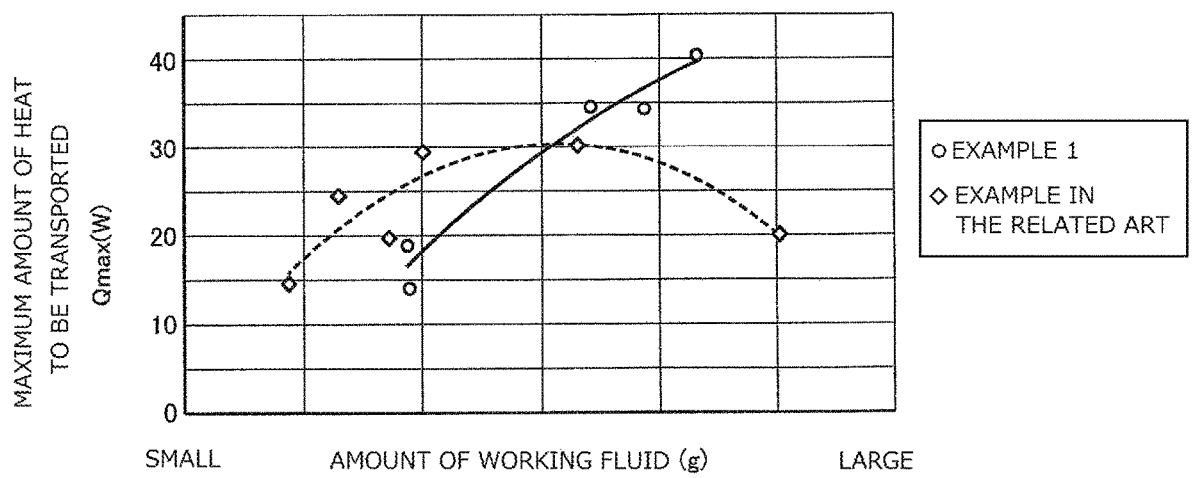
FIG. 6 is a graph illustrating the maximum amount of heat, which is transported by a flat heat pipe, with respect to the amount of working fluid, and illustrates the measured results of a flat heat pipe (example in the related art) according to an embodiment in the related art and an embodiment (Example 1) of the invention.
Figure 7:
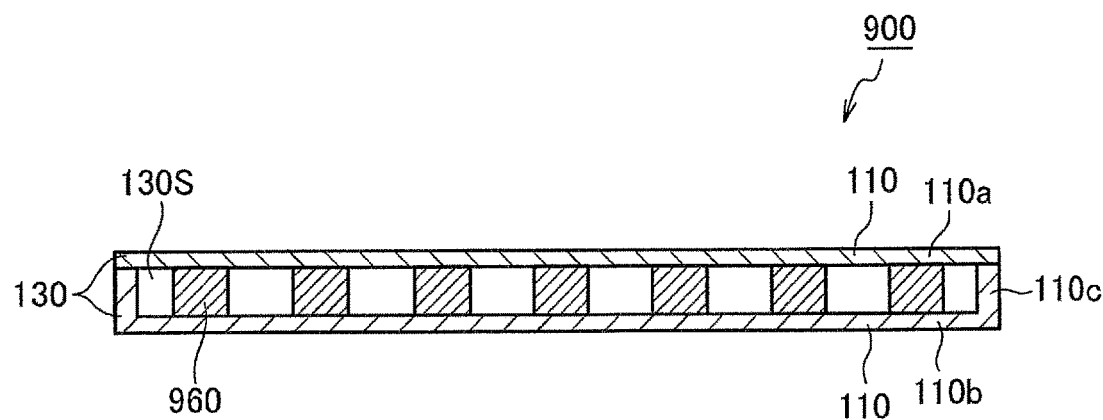
FIG. 7 is a longitudinal sectional view of a flat heat pipe (example in the related art) according to an embodiment in the related art.

Actually, FIG. 6 illustrates the results of comparison between the heat transport capacity (the maximum amount of heat to be transported) of the flat heat pipe according to the invention and the heat transport capacity of the flat heat pipe in the related art. FIG. 6 illustrates the measurement results of the maximum amount Qmax of heat, which is transported by the flat heat pipe 100 of Example 1, and the maximum amount Qmax of heat, which is transported by an example of the flat heat pipe in the related art (example in the related art), with respect to the amount of working fluid that is represented on a horizontal axis. In the example in the related art, as illustrated in FIG. 7, the mesh structure 150 is not disposed in the flat heat pipe 100 of Example 1 and solid pillars 960 are disposed between the upper and lower plates 110a and 110b instead. In the example in the related art, the top surfaces of the pillars are in contact with the inner surface of the upper plate 110a and the bottom surfaces of the pillars 960 are in contact with the inner surface of the lower plate 110b to suppress the deformation of the upper and lower plates 110a and 110b. However, since the pillars 960 are solid, steam cannot pass through the pillars 960 unlike in Example 1.

In this measurement, the maximum amount of heat to be transported was measured as follows. One end of each heat pipe in a longitudinal direction is referred to as a heating portion (high-temperature portion) on which a heater is mounted, and the other end thereof is referred to as a cooling portion (low-temperature portion). Since the temperature of the heating portion continues to rise as the power (the amount of heat) of the heater is increased, dryout where all working fluid is evaporated occurs at the heating portion. In a case this dryout occurs, it can be said that the heat pipe has reached the limit of heat transport. For this reason, the value of the power of the heater immediately before dryout was regarded as the maximum amount of heat that could be transported by the heat pipe. Further, the temperature of the heating portion was measured, and a point of time when the temperature of the heating portion soared without being stabilized was regarded as the occurrence of dryout.

In addition, main parameters of each heat pipe are as follows.

The length of each heat pipe between the heating portion and the cooling portion: 120 mm The length of each heat pipe in the lateral direction: 30 mm The container 130 of the example in the related art: the material, the shape, and the size of the container 130 of the example in the related art are the same as those of Example 1

The solid pillar 960 of the example in the related art: the shape of a column having a diameter of 1 mm, a height is 0.4 mm, the interval d3 between the pillars is 5 mm, and the pillar is made of stainless steel As illustrated in FIG. 6 by the measured results (illustrated by rhombic marks) of the flat heat pipe according to the example in the related art, since the dryout of working fluid is likely to occur in a region where the amount of working fluid is small, the maximum amount of heat to be transported is small. However, since it is more difficult for dryout to occur as the amount of working fluid is increased, the maximum amount of heat to be transported is also increased. Then, in a case where the amount of working fluid exceeds a predetermined value, the maximum amount of heat to be transported is reduced again. In a case where the amount of working fluid is excessively increased, the flow of steam to the low-temperature portion from the high-temperature portion interferes with the flow of fluid flowing back to the high-temperature portion from the low-temperature portion. For this reason, fluid is blown by steam, so that the amount of fluid to flow back is reduced. Accordingly, the dryout of working fluid is likely to occur again, so that the maximum amount of heat to be transported is reduced. Therefore, since it is known that the maximum amount of heat to be transported has characteristics corresponding to the shape of a mountain with respect to the amount of working fluid as illustrated by a dotted line of FIG. 6, the amount of working fluid near a peak value is generally selected and enclosed.

In contrast, in regard to the measured results (illustrated by circular marks) of the flat heat pipe 100 according to Example 1, characteristics corresponding to the shape of a mountain is shifted to a side where the amount of working fluid is large, so that the peak value of the shape of a mountain is increased. Specifically, the maximum amount Qmax of heat to be transported was increased by about 30%. It is thought that an effect of increasing the maximum amount of heat to be transported is obtained since the protruding portions 170 supporting the upper and lower plates 110a and 110b do not obstruct steam passages.

An example of the flat heat pipe according to the invention has been described above, but the description of this embodiment is not limited thereto. The detailed structure and the like of the flat heat pipe of this embodiment can be appropriately modified without departing from the scope of the invention. For example, in the above-mentioned flat heat pipes 100, 200, and 300, the protruding portions 170 have been formed integrally with the substantially flat sheet-like member by embossing. However, as long as the protruding portions 170 are hollow and are formed in the shape of a protrusion so as to support the upper and lower plates 110a and 110b, the protruding portions 170 may be separately formed and may be integrated with the substantially flat sheet-like member in a post-process. For example, a sheet-like member forming the protruding portions 170 may be joined to a substantially flat sheet-like member, or through-holes having substantially the same shapes as the bottom surfaces of protruding portions 170 may be formed in a substantially flat sheet-like member and the protruding portions 170 may be then inserted into and joined to the through-holes. In addition, the substantially flat sheet-like member 180 of the flat heat pipe 300 may be provided between the sheet-like member 140 and each of the upper and lower plates 110a and 110b. Since the anisotropy of the flat heat pipe 300 in the vertical direction is removed in that case, the degree of freedom in mounting in a case where the flat heat pipe is used for an electronic device or the like is improved. Further, all the protruding portions 170 of the above-mentioned flat heat pipes 100, 200, and 300 are hollow protrusions, but both hollow protrusions and non-hollow protrusions may be used together.

EXPLANATIONS OF LETTERS OR NUMERALS 100, 200, 300 FLAT HEAT PIPE
110, 110a, 110b METAL PLATE
130 CONTAINER
130S CAVITY
140, 180 SHEET-LIKE MEMBER
150, 250, 350 WICK STRUCTURE
160 PLANAR PORTION (PORTION IN WHICH PROTRUDING PORTIONS ARE NOT FORMED)
170 PROTRUDING PORTION
d1 HEIGHT OF INTERNAL SPACE OF PROTRUDING PORTION
d2 THICKNESS OF SHEET-LIKE MEMBER
d3 INTERVAL BETWEEN PROTRUDING PORTION

The invention claimed is:

1. A flat heat pipe comprising:
a container in which a cavity is formed by two plates made of metal and facing each other;
working fluid that is enclosed in the cavity; and
a wick structure that is inserted into the container,
wherein the wick structure includes a first sheet-like member, a hollow protruding portion protruding from the first sheet-like member in a height direction of the container, and a planar portion of the first sheet-like member on which the protruding portion is not formed;
wherein the hollow protruding portion is configured to permit steam to pass therethrough; and
wherein the porosity of the protruding portion is in the range of 60% to 90% and the porosity of the planar portion is lower than the porosity of the protruding portion by 10% or more and is in the range of 50% to 80%.

2. The flat heat pipe according to claim 1,
wherein the height of an internal space of the protruding portion is equal to or larger than the thickness of the first sheet-like member.

3. The flat heat pipe according to claim 1,
wherein the first sheet-like member has a mesh structure, a nonwoven structure, or a porous structure.

4. The flat heat pipe according to claim 1,
wherein the wick structure further includes a substantially flat second sheet-like member having a mesh structure, a nonwoven structure, or a porous structure.

5. The flat heat pipe according to claim 1,
wherein the material of the wick structure is any one of copper, iron, stainless steel, and a metal alloy that contains copper or iron as a main component.

6. The flat heat pipe according to claim 1,
wherein the surfaces of the plates are substantially flat.

7. The flat heat pipe according to claim 1,
wherein the protruding portion is a protrusion that is formed by embossing of the first sheet-like member.

\* \* \* \* \*